(12) United States Patent
Omarjee et al.

(10) Patent No.: US 8,343,860 B1
(45) Date of Patent: Jan. 1, 2013

(54) HIGH C CONTENT MOLECULES FOR C IMPLANT

(75) Inventors: Vincent M. Omarjee, Albany, NY (US); Christian Dussarrat, Wilmington, DE (US); Jean-Marc Girard, Tokyo (JP); Nicolas Blasco, Grenoble (FR)

(73) Assignees: L'Air Liquide Societe Anonyme pour l'Etude et l'Exploitation des Procedes Georges Claude, Paris (FR); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 13/041,127

(22) Filed: Mar. 4, 2011

Related U.S. Application Data

(60) Provisional application No. 61/316,678, filed on Mar. 23, 2010.

(51) Int. Cl.
*H01L 21/425* (2006.01)
(52) U.S. Cl. ......... 438/515; 438/510; 438/513; 438/514
(58) Field of Classification Search ................. 438/510, 438/513–515
See application file for complete search history.

(56) References Cited

U.S. PATENT DOCUMENTS

| | | | | |
|---|---|---|---|---|
| 5,089,746 | A * | 2/1992 | Rosenblum et al. | 315/111.81 |
| 7,393,765 | B2 | 7/2008 | Hanawa et al. | |
| 2002/0160587 | A1 | 10/2002 | Jagannathan et al. | |
| 2006/0019039 | A1* | 1/2006 | Hanawa et al. | 427/523 |
| 2007/0238234 | A1 | 10/2007 | Wang et al. | |
| 2008/0299749 | A1 | 12/2008 | Jacobson et al. | |
| 2009/0200494 | A1 | 8/2009 | Hatem et al. | |
| 2009/0286367 | A1* | 11/2009 | Krull et al. | 438/515 |
| 2010/0029053 | A1* | 2/2010 | Itokawa et al. | 438/306 |
| 2010/0112795 | A1 | 5/2010 | Kaim et al. | |
| 2011/0002011 | A1 | 1/2011 | Endo | |
| 2011/0171817 | A1* | 7/2011 | Lee et al. | 438/513 |

FOREIGN PATENT DOCUMENTS

WO  WO 2007 070321  6/2007

OTHER PUBLICATIONS

Tieger, D.R. et al. "Optima HD Imax: Molecular implant." 2008 AIP Conf. Proc. vol. 1066 p. 336-339.*
Felch, S. B, et al., "Plasma doping for the fabrication of ultra-shallow junctions," Surface and Coatings Technology 156 (2002) pp. 229-236.
Jain, I.P. et al., "Ion beam induced surface and interface engineering," Surface Science Reports 66 (2011) pp. 77-172.
Pichler, P. et al,, "Future challenges in CMOS process modeling," Thin Sold Films 518 (2010) pp. 2478-2484.
Renau, A. et al., "Comparison of plasma doping and beamline technologies for low energy ion implantation," 2002 Proceedings of the 14th International Conference on Ion Implantation Technology, Sep. 22-27, 2002, p. 151-156.

* cited by examiner

*Primary Examiner* — Fernando L Toledo
*Assistant Examiner* — Bryan Junge
(74) *Attorney, Agent, or Firm* — Patricia E. McQueeney; Allen E. White

(57) ABSTRACT

The present invention provides molecules with high carbon content for Carbon-containing species implant in semiconductor material. The molecules can be used in various doping techniques such as ion implant, plasma doping or derivates methods.

9 Claims, No Drawings

HIGH C CONTENT MOLECULES FOR C IMPLANT

TECHNICAL FIELD

Disclosed herein are non-limiting embodiments of compositions and methods used in the manufacture of semiconductor, photovoltaic, LCD-TFT, or flat panel type devices.

BACKGROUND ART

Carbon is a commonly used implant species. It can be implanted alone for carbon doping. Alternatively carbon and one or more other species are used to form a heterogeneous doping. In this case the carbon ion is called a co-implant for the other species, generally a pre-amorphization implant (PAI) species such as Germanium, Phosphorous or Boron. The carbon is positioned between a shallow dopant and end-of-range (EOR) damage caused by the PAI species. The carbon acting as a substituent here will block some interstitials coming back from EOR during the annealing step. It would then avoid transient enhanced diffusion (TED) or boron interstitial cluster formation (BIC). Carbon range also often overlaps with the PAI species and contributes to PAI by itself. Another application of carbon doping is to create compressive strain. In a source/drain in a transistor device created from SIC, carbon implantation will cause tensile strain in the channel. This stress is beneficial for NMOS for instance.

Carbon implantation is challenging. It can be done by epitaxial growth or high dose implant however this can cause amorphization of the silicon re-grown.

Many molecules and techniques have been used for carbon implant. For instance, Hatem, et al. (US 20090200494 A1, Varian) describes the use of a cold implantation process. They describe a low temperature process using gases such as methane, ethane, propane, bibenzyl, butane and pyrene ($C_{16}H_{10}$) or possible using molecular carbon in combination with diborane, pentaborane, carborane, octaborane, decaborane, or octadecaborane.

Jagannathan et al. (US2002160587A1, IBM) described the doping of Si or SiGe using boron or carbon for heterojunction bipolar transistors (HTB). The carbon containing gas is $C_2H_4$.

Jacobson et al. (US2008299749A1) described a method for cluster ion implantation for defect engineering. The method consists of implanting using an ion beam formed from ionized molecules. In the method, molecular cluster dopant ions are implanted into a substrate with or without a co-implant of non-dopant cluster ion (carbon cluster ion for instance). The dopant ion is implanted into the amorphous layer created by the co-implant in order to reduce defects in the crystalline structure (and reducing the leakage current thus improving the performances of the semiconductor junctions). The use of $C_nH^+$ type molecules is generally described and more specifically the use of $C_{16}H_{10}$ solid and not volatile with a high temperature melting point) and $C_7H_7$.

Suitable techniques that can be used for carbon implantation include standard ion beam (beamline), plasma doping, or pulsed plasma doping ($P^2$LAD), plasma Immersion Ion Implantation (PI3), including the many related variants of these techniques known in the art.

DISCLOSURE OF THE INVENTION

The present invention is related to a method of manufacturing semiconductor devices in which the carbon doping is done using high carbon content molecules.

In one embodiment, molecules with high carbon content and low hydrogen to carbon ratio (C:H>0.6, preferably >1) are used as the carbon source molecule for carbon ion implantation.

In another embodiment, implanting carbon with a co-implant of Boron or other atoms can enhance devices properties as discussed in the background. The boron co-implant can be accomplished using standard boron compounds such as $B_{18}H_{22}$, $BF_3$, diborane, decaborane or a boron cluster. In other aspects, the method may include implanting the target material with other species such as Germanium, Phosphorous, Silicon, Arsenic, Xenon, Nitrogen, Aluminum, Magnesium, Silver, Gold, Fluorine, and combinations thereof.

In some embodiments, the method may be used to create material strain and fabricate an ultra-shallow junction in the target material.

The Invention may be further defined in part by the following numbered sentences:

1. A method of implanting carbon into a substrate, the method comprising, consisting essentially of, or consisting of a step of carbon implantation into the substrate with a starting carbon source molecule having a carbon to hydrogen ratio equal to or more than 0.6, preferably more than 1.
2. The method of sentence 1, wherein the carbon implantation step is performed by an ion beam (beamline), plasma doping or pulsed plasma doping ($P^2$LAD), or Plasma Immersion Ion Implantation (PI3) process.
3. The method of sentences 1 or 2, wherein the carbon is co-implanted with other element(s).
4. The method of sentences 1, 2, or 3, wherein the other element(s) is implanted by the same and/or a separate step of implantation by an ion beam (beamline), plasma doping or pulsed plasma doping ($P^2$LAD), or Plasma Immersion Ion Implantation (PI3) process.
5. The method of sentences 3 or 4 wherein at least one of the other element(s) co-implanted is selected within Germanium, Phosphorous, Silicon, Arsenic, Xenon, Nitrogen, Aluminum, Magnesium, Silver, Gold, Boron or Fluorine.
6. The method of sentence 5, wherein the element(s) co-implanted include Boron provided as a boron cluster, $B_{18}H_{22}$, $BF_3$, diborane or decaborane.
7. The method of sentences 1, 2, 3, 4, 5, or 6 wherein the implantation is followed by an annealing step such as a thermal and/or UV annealing.
8. The method of sentences 1, 2, 3, 4, 5, 6, or 7, wherein the carbon source molecule comprises $C_6F_6$.
9. The method of method of sentences 1, 2, 3, 4, 5, 6, 7 or 8, wherein the carbon source molecule comprises one or more of diphenylacetylene, naphthalene, azulene, cyclooctatetraene, benzene, norbornadiene, cycloheptatriene, cyclohexadiene, cyclopentadiene, pentadiene, hexadiene, diethynylbenzene, phenylacetylene, phenylpropyne, ethynyltoluene, hexadiyne, phenyl butyne, 2,5-heptadiyne, (tButyl)phenylacetylene, methylbutenyne, cyclopropylacetylene, ethynylcyclohexene, cyclopentylacetylene, cyclohexylacetylene and dimethylbutyne.
10. The method of method of sentences 1, 2, 3, 4, 5, 6, 7 or 8, wherein the carbon source molecule comprises acetylene.
11. The method of sentences 1, 2, 3, 4, 5, 6, or 7, wherein the carbon source molecule is represented by the general formula CxHy with x and y being an integer >0.
12. The method of sentence 11, wherein x/y ratio is >0.6.
13. The method of sentence 12, wherein the ratio x/y≦1.
14. The method of sentences 1, 2, 3, 4, 5, 6, 7, 8, 9, 10, 11, 12 or 13, wherein the implantation step comprises a reaction in a plasma that leads to the generation of a new molecular species, preferably a molecule or molecular cluster having 5 or more carbon atoms, that is the molecular species implanted into the substrate.

15. The method of sentences 1, 2, 3, 4, 5, 6, 7, 8, 9, 10, 11, 12, 13 or 14, wherein the new molecular species contains at least one ring strain and/or one or more unsaturated bonds.

MODES FOR CARRYING OUT THE INVENTION

Carbon implantation may be performed by any know procedure in the art including:

Ion beam (beamline) implantation may be used as described in I. P. Jain and Garima Agarwal, Ion beam induced surface and interface engineering, Surface Science Reports, Volume 66, Issues 3-4, March 2011, Pages 77-172, ISSN 0167-5729, DOI: 10.1016/j.surfrep.2010.11.001.

Plasma doping or pulsed plasma doping ($P^2LAD$) may be used as described in Felch, S. B, Fang, Z., Kao, B.-W., Liebert, R. B., Walther, S. R., Hacker, D. Plasma doping for the fabrication of ultra-shallow junctions (2002) Surface and Coatings Technology, 156 (1-3), pp. 229-236.

Any hydrogen co-implanted may, as needed, be removed thereafter by an annealing step such as a standard thermal annealing and/or a UV photoannealing step.

Preferred carbon source molecules for carbon implantation are listed in

TABLE 1

| Name | Formula | Melting point (C.) | Boiling Point (C.) | Vapor Pressure (Torr) | [C/H] ratio |
|---|---|---|---|---|---|
| $C_6F_6$ | $C_6F_6$ | 4 | 81 | 95 (25 C.) | 0 |
| Diphenylacetylene | $C_{14}H_{10}$ | 62.5 | 300 | 20 (170 C.) | 1.4 |
| Naphtalene | $C_{10}H_8$ | 80 | 218 | 1 (53 C.) | 1.25 |
| Azulene | $C_{10}H_8$ | 100 | 242 | 0.0091 (25 C.) | 1.25 |
| Cyclooctatetraene | $C_8H_8$ | −5 | 142 | 7.9 (25 C.) | 1 |
| Benzene | $C_6H_6$ | 5.5 | 80 | 100 (26 C.) | 1 |
| Acetylene | H—C≡C—H | NA | −84 | 33400 (20 C.) | 1 |
| BCHD | $C_7H_8$ | −19 | 89 | 50 (20 C.) | 0.88 |
| Cycloheptatriene | $C_7H_8$ | −80 | 116 | 18 (20 C.) | 0.88 |
| Cyclopentadiene | $C_5H_6$ | −85 | 41 | 400 (20 C.) | 0.83 |
| Cyclohexadiene | $C_6H_8$ | −49 | 88 | 77 (25 C.) | 0.75 |
| Pentadiene | $C_5H_8$ | −87 | 42 | 620 (37 C.) | 0.63 |
| Hexadiene | $C_6H_{10}$ | −141 | 60 | 367 (37 C.) | 0.6 |
| Diethynylbenzene | $C_{10}H_6$ 1785-61-1 | Solid | 188 C. | 14 (78 C.) | 1.67 |
| Phenylacetylene | $C_8H_6$ 536-74-3 | −45 C. | 142 C. | 7 (25 C.) | 1.3 |
| Phenyl propyne | $C_9H_8$ 673-32-5 | Liquid <20 C. | 183 | 1.2 (25 C.) | 1.125 |
| Phenyl propyne | $C_9H_8$ 10147-11-2 | Liquid <20 C. | NA | 20 (75 C.) | 1.125 |
| Ethynyltoluene | $C_9H_8$ 766-97-2 | Liquid <20 C. | 168 C. | NA | 1.125 |
| Hexadiyne | $C_6H_6$ 2809-69-0 | 68 | 128 C. | ~12 (25 C.) | 1 |
| Phenyl butyne | $C_{10}H_{10}$ 16520-62-0 | Liquid <20 C. | 190 C. | NA | 1 |
| 2,5-Heptadiyne | $C_7H_8$ 50428-63-2 | NA | 1400 | 7 (25 C.) | 0.88 |

TABLE 1-continued

| Name | Formula | Melting point (C.) | Boiling Point (C.) | Vapor Pressure (Torr) | [C/H] ratio |
|---|---|---|---|---|---|
| (tButyl) phenylacetylene | $C_{12}H_{14}$ 772-38-3 | Liquid | NA | 2 (est.) (70 C.) | 0.857 |
| Methylbutenyne | $C_5H_6$ 78-80-8 | −113 | 32 | 750 (30 C.) | 0.83 |
| Cyclopropyl acetylene | $C_5H_6$ 6746-94-7 | Liquid | 52-65 C. | NA | 0.83 |
| Ethynylcyclohexene | $C_8H_{10}$ 931-49-7 | Liquid <20 C. | ~150 | ~5 (25 C.) | 0.8 |
| cyclopentyl-acetylene | $C_7H_{10}$ 930-51-8 | Liquid <20 C. | 105 | NA | 0.7 |
| Cyclohexyl-acetylene | $C_8H_{12}$ 931-48-6 | Liquid <20 C. | 130 | NA | 0.67 |
| dimethylbutyne | $C_6H_{10}$ 917-92-0 | −78 | 37 | 410 (20 C.) | 0.6 |

$C_6F_6$ is a preferred combination carbon and fluorine source molecule for co-implantation of both carbon and fluorine. $C_6F_6$ ionization yields $C_5F_3^+$ as an active implant species.

Ionic species derived from a carbon source molecule are generally the more active implantation species. The carbon source molecules of Table 1 are preferred in part because of their ionization patterns, some of which are demonstrated in the following ionization data:

1,3-Cyclohexadiene ionization yields $C_6H_7^+$.

1,3-hexadiene ionization yields $C_5H_7^+$; $C_6H_9^+$; $C_4H_6^+$.

Acetylene ionization yields predominant species $C_2H_2^+$; $C_2H^+$.

Cycloheptatriene ionization yields $C_2H_3^+$; $C_3H_3^+$; $C_4H_3^+$; $C_5H_3^+$; $C_5H_5^+$; $C_7H_7^+$; $C_7H_8^+$.

1,6-heptadiyne ionization yields $C_2H_3^+$; $C_3H_3^+$; $C_4H_3^+$; $C_5H_3^+$; $C_5H_5^+$; $C_7H_7^+$; $C_7H_8^+$.

Norbornadiene ionization yields $C_2H_3^+$; $C_3H_3^+$; $C_4H_3^+$; $C_5H_3^+$; $C_5H_5^+$; $C_7H_7^+$; $C_7H_8^+$.

Naphtalene ionization yields $C_{10}H_7^+$.

1,2,5,7-cyclooctatetraene ionization yields $C_8H_7^+$; $C_6H_6$; $C_4H_4$; $C_3H_3$; $C_2H_3$.

Benzene ionization yields $C_6H_5^+$.

1,3-cyclopentadiene ionization yields $C_5H_5^+$; $C_3H_4$; $C_3H_3^+$.

1,4-pentadiene ionization yields $C_5H_7^+$; $C_4H_5^+$; $C_3H_3^+$.

1,5-hexadiene ionization yields $C_5H_7^+$; $C_3H_6^+$; $C_4H_6^+$; $C_3H_3^+$.

1,4-diethynylbenzene ionization yields $C_{10}H_6$)

Phenylacetylene ionization yields $C_8H_5^+$.

2,4-hexadiyne ionization yields $C_4H_3^+$; $C_4H_4^+$.

Methylbutenyne ionization yields $C_5H_5^+$; $C_3H_4^+$; $C_3H_3^+$; $C_4H_3^+$; $C_4H_2^+$.

Ethynylcyclopropane ionization yields $C_5H_5^+$.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of implanting carbon into a substrate, comprising a step of carbon implantation into the substrate with a starting carbon source molecule selected from one or more of cyclooctatetraene, norbornadiene, cycloheptatriene, cyclohexadiene, cyclopentadiene, pentadiene, hexadiene, hexadiene, 1,5-hetadiyne, methylbutenyne, cyclopropylacetylene, ethynylcyclohexene, cyclopentylacetylene, cyclohexylacetylene, $C_6F_6$ and methylbutyne.

2. The method of claim 1, wherein the carbon implantation step is performed by an ion beam (beamline), plasma doping or pulsed plasma doping ($P^2$LAD), or Plasma Immersion Ion Implantation (PI3) process.

3. The method of claim 2, wherein the carbon is co-implanted with other element(s).

4. The method of claim 3, wherein the other element(s) is implanted by the same and/or a separate step of implantation by an ion beam (beamline), plasma doping or pulsed plasma doping ($P^2$LAD), or Plasma Immersion Ion Implantation (PI3) process.

5. The method of claim 4, wherein at least one of the other element(s) co-implanted is selected within Germanium, Phosphorous, Silicon, Arsenic, Xenon, Nitrogen, Aluminum, Magnesium, Silver, Gold, Boron or Fluorine.

6. The method of claim 5, wherein the element(s) co-implanted include Boron provided as a boron cluster, $B_{18}H_{22}$, $BF_3$, diborane or decaborane.

7. The method of claim 1, wherein the implantation is followed by an annealing step.

8. The method of method of claim 1, wherein the carbon source molecule further comprises acetylene.

9. The method of claim 1, wherein the new molecular species contains at least one ring strain and/or one or more unsaturated bonds.

* * * * *